US 6,772,261 B1

(12) United States Patent
D'Antonio et al.

(10) Patent No.: US 6,772,261 B1
(45) Date of Patent: Aug. 3, 2004

(54) INTERFACE THAT ALLOWS TESTING AND USING MEMORY MODULES IN COMPUTER SYSTEMS NOT DESIGNED FOR THE MODULES

(75) Inventors: Richard A. D'Antonio, Bristol, VT (US); James A. Pelkey, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/559,710

(22) Filed: Apr. 27, 2000

(51) Int. Cl.[7] .................................................. G06F 1/00
(52) U.S. Cl. ........................ 710/301; 710/300; 710/306; 710/316; 711/115; 365/63
(58) Field of Search ............................... 710/300–304, 710/305–307, 311, 316, 317, 62–64, 72; 711/104, 105, 115, 147–149, 5, 4; 365/63

(56) References Cited

U.S. PATENT DOCUMENTS

| | | | |
|---|---|---|---|
| 5,375,084 A | * 12/1994 | Begun et al. ................. 365/63 |
| 5,440,755 A | * 8/1995 | Harwer et al. ............... 710/305 |
| 5,446,860 A | * 8/1995 | Dresser et al. .............. 711/100 |
| 5,524,232 A | * 6/1996 | Hajeer ......................... 710/301 |
| 5,611,055 A | 3/1997 | Krishan et al. |
| 5,751,728 A | 5/1998 | Katanosaka |
| 5,771,474 A | 6/1998 | Matt et al. |
| 5,790,447 A | 8/1998 | Laudon et al. |
| 5,852,617 A | 12/1998 | Mote, Jr. |
| 5,859,792 A | 1/1999 | Rondeau, II et al. |
| 5,951,665 A | * 9/1999 | Crane, Jr. et al. ........... 710/306 |
| 5,963,464 A | 10/1999 | Dell et al. |
| 5,995,405 A | * 11/1999 | Trick ............................ 365/63 |
| 6,002,605 A | 12/1999 | Iwasaki et al. |
| 6,004,139 A | 12/1999 | Dramstad et al. |
| 6,011,741 A | 1/2000 | Wallace et al. |
| 6,092,146 A | * 7/2000 | Dell et al. ...................... 711/5 |
| 6,108,730 A | * 8/2000 | Dell et al. .................... 710/302 |
| 6,222,739 B1 | * 4/2001 | Bhakta et al. ............... 361/790 |
| 6,261,104 B1 | * 7/2001 | Leman .......................... 439/61 |
| 6,363,450 B1 | * 3/2002 | Lash et al. ................... 710/301 |
| 6,381,662 B1 | * 4/2002 | Harari et al. ................ 710/302 |
| 6,401,152 B1 | * 6/2002 | Solomon et al. ............ 710/104 |
| 6,625,692 B1 | * 9/2003 | Stubbs et al. ................ 711/115 |

OTHER PUBLICATIONS

IBM Technical Disclosure Bulletin, Memory Card Adaptor with Direct Current Step–up Transformer, 10/97, vol. 40, No.10, pp. 141–142.
IBM Technical Disclosure Bulletin, Memory Expansion Concept of Notebook PC, 08/94, vol. 37, No. 08, pp. 423–424.

* cited by examiner

Primary Examiner—Paul R. Myers
Assistant Examiner—Raymond N Phan
(74) Attorney, Agent, or Firm—Schmeiser, Olsen & Watts; William H. Steinberg

(57) ABSTRACT

An interface is provided that allows testing and using in-line memory modules in computer systems not designed for the modules. In particular, an interface of the present invention comprises an interposer card that fits into a motherboard memory module connection of a computer system. The interposer card also has a motherboard memory module connection system into which a memory module fits. Additionally, the interposer card contains a detection device that describes the configuration of the memory module. This allows the computer system to properly access the memory module.

When used as part of a computer system, the interface allows memory modules to be tested by a memory diagnostics program. Moreover, the interface may be placed in any slot in the computer, even though the memory module itself only supports being placed in one particular slot.

21 Claims, 6 Drawing Sheets

| Byte Number | Function Described |
|---|---|
| 0 | Number of Serial PD Bytes written during module production |
| 1 | Total number of bytes Serial PD device |
| 2 | Fundamental Memory Type (FPM, EDO, SDRAM, ....) |
| 3 | Number of Row Addresses on this Assembly |
| 4 | Number of Column Addresses on this Assembly |
| 5 | Number of DIMM Banks |
| 6-7 | Data Width of this Assembly |
| 8 | Voltage interface Level of this Assembly |
| 9 | SDRAM Cycle time at Maximum Supported CAS Latency (CL), CL = X |
| 10 | SDRAM Access from Clock |
| 11 | Dimm configuration type (non-Parity, Parity or ECC) |
| 12 | Refresh Rate/Type |
| 13 | Primary SDRAM Width |
| 14 | Error Checking SDRAM Width |
| 15 | SDRAM Device Attributes: Minimum Clock Delay, Back-to-Back Random Column Access |
| 16 | SDRAM Device Attributes: Burst Lengths Supported |

FIG. 6

INTERFACE THAT ALLOWS TESTING AND USING MEMORY MODULES IN COMPUTER SYSTEMS NOT DESIGNED FOR THE MODULES

BACKGROUND OF THE INVENTION

1. Technical Field

This invention relates to the field of memory modules. More specifically, the invention relates to an interface that allows testing and using in-line memory modules in computer systems not designed for the modules.

2. Background Art

All computer systems use some type of volatile memory that only maintains its contents when the computer system is on. To maintain flexibility and allow memory to be upgraded, changed, or added, most memory comes on cards. These cards then are connected to the computer system through connectors. A popular version of these types of cards are called "In-Line Memory Modules" (IMMs). These IMMs are thin cards that have a male edge connector. The edge connector has a number of copper runs on both sides, and the copper runs are connected to lines, which are in turn connected to the memory chips and other necessary chips on the IMM. The edge connector fits into a female socket that has corresponding copper runs or tabs that match with and connect to the copper tabs on the IMM.

With this type of memory system, memory may easily be added, removed, or changed. Nonetheless, there are times when a memory module cannot be used or tested in particular computer systems.

What is needed is a device that allows memory modules that cannot be used in particular computer systems to be used in those systems.

DISCLOSURE OF INVENTION

Before proceeding to a discussion of the current invention, a more detailed discussion of the problem is beneficial. As is known in the art, many In-Line Memory Modules (IMMs) contain Serial Presence Detect (SPD) modules. In particular, Dual IMMs (DIMMs) contain SPD modules, as do Small Outline DIMMs (SODIMMs). These SPD devices contain a variety of configuration information that allow the computer system to determine how large the memory module is, how fast the memory is, etc.

Laptops and other small computers generally use IMMs that are slightly different than normal IMMs used in, for example, personal computers, servers, or workstations.

Because the latter are generally in large boxes where space is only a minor consideration, the physical size of memory can be relatively large. For laptops, on the other hand, the physical size of the memory is very important, as there is limited space in a laptop. Consequently, IMMs for laptops and other computers (such as hand-helds) are smaller than are IMMs for "large" computers. For example, DIMMs are very popular for personal computers, workstations, and servers. The equivalent memory for laptops is a smaller version of DIMMs, called SODIMMs. These SODIMMs also have less copper tabs (144 instead of 168 on the DIMMs) and thus require a smaller memory expansion slot.

Another difference between large and small computer systems is the number of motherboard memory module connections. In general, a large computer will have several expansion slots for IMMs. These slots are commonly labeled "Slot 0", "Slot 1", etc. To accommodate these extra slots, large computers will assign different addresses to the SPD device on each IMM. To do this, the address lines for the SPD device are tied to a combination of ground or power prior to where the address lines connect to the IMMs.

Small computers, on the other hand, have only one or at most two motherboard memory module connections. Accordingly, the address lines to the SPD on each IMM are tied to a constant voltage line, normally ground.

A problem occurs when the IMMs for small computers, such as SODIMMs, arrive before the portable computer arrives. Because the design of laptop and other small computers tend to lag larger computer design, the IMMs for small computers arrive before the small computers themselves arrive. This means that there are no actual computer systems with which to test the new IMMs, as the smaller IMMs do not fit into the memory slots for the larger computers. For instance, 133 Megahertz (MHz) computer memory is currently available for laptops, but there are few or no laptops that support this speed of memory. Although there are test systems that allow the memory to be tested, test system timing is normally different than real computer system timing. Because of this, it is beneficial to test the cards in an actual computer system environment.

Even if one could create an interposer card that allows the SODIMMs to fit into the interposer and then into the DIMM slot, a SODIMM would only work in Slot 0 because the addresses on the SODIMM for the SPD are grounded. When the large computer first starts up, it tries to determine if the memory slots have memory in them. The computer system communicates with each SPD device on each DIMM in each slot. Essentially, the Basic Input Output System (BIOS) causes the processor to attempt to communicate with the SPD devices through a serial connection to which each device is connected. The processor sends a series of bits to the SPD devices over the serial connection, and the series of bits contains an SPD address. As stated previously, each SPD device should have a different address. The processor will search an SPD device at one of the addresses by sending out a command for one of the addresses, and then waiting for a response.

If the computer receives an appropriate answer from a DIMM, it knows that the slot contains a memory module. Then the computer will go about reading configuration information from the SPD to enable the computer to properly access the memory. If, however, the computer system does not receive a proper response, then the computer system will assume that this slot does not contain a memory module. When the computer system would access the SPD on the SODIMM (on the interposer) in a slot other than Slot 0, the SPD will respond, essentially, that it is in Slot 0. This response occurs because all of its SPD address pins are grounded, which indicates that it is in slot zero. Thus, even if an interposer could be developed to allow SODIMMs to be placed in a DIMM slot, this interface could only be placed in Slot 0. When an engineer goes to test hundreds of SODIMMs, this limitation seriously impedes how quickly the testing can be performed.

To overcome these problems, the current invention provides an interface that allows testing and using in-line memory modules in computer systems not designed for the modules. In particular, an interface of the present invention comprises an interposer card that fits into a motherboard memory module connection of a computer system. The interposer card also has a motherboard memory module connection system into which a memory module fits.

Additionally, the interposer card contains a detection device that describes the configuration of the memory module. This allows the computer system to properly access the memory module.

When used as part of a computer system, the interface allows memory modules to be tested by a memory diagnostics program. Moreover, the interface may be placed in any slot in the computer, even though the memory module itself only supports being placed in one particular slot.

Thus, the interface of the current invention allows memory modules to be tested and used in computers that do not normally support a particular form of memory module.

The foregoing and other features and advantages of the present invention will be apparent from the following more particular description of preferred embodiments of the invention, as illustrated in the accompanying drawings.

BRIEF DESCRIPTION OF DRAWINGS

Preferred embodiments of the present invention will hereinafter be described in conjunction with the appended drawings, where like designations denote like elements, and:

FIG. 6 is an example of some of the bytes used in a serial presence detect device that provide information about a memory module.

BEST MODE(S) FOR CARRYING OUT THE INVENTION

To solve these problems, the current invention provides an interface that allows testing and using in-line memory modules in computer systems not designed for the modules. In particular, an interface of the present invention comprises an interposer card that fits into a motherboard memory module connection of a computer system. The interposer card also has a motherboard memory module connection system into which a memory module fits. Additionally, the interposer card contains a detection device that describes the configuration of the memory module. This allows the computer system to properly access the memory module.

When used as part of a computer system, the interface allows memory modules to be tested by a memory diagnostics program. Moreover, the interface may be placed in any slot in the computer, even though the memory module itself only supports being placed in one particular slot.

Thus, the interface of the current invention allows memory modules to be tested and used in computers that do not normally support the memory modules.

In particular, for Small Outline Dual In-Line Memory Modules (SODIMMs), these memory modules use a 144 pin connection system. Additionally, they contain a detection device commonly called a Serial Presence Detect (SPD) device, which is normally an Electrically Programmable Read Only Memory (EPROM), that contains configuration information. This configuration information, as is well known in the art, allows the computer to properly access the memory module. Because these memory modules are normally used in laptops and other small computers requiring small memory module sizes, the address lines going to the SPD device are grounded. This grounding occurs directly on the memory module, and is useful because these small computers only contain one or two motherboard memory module connections, such as SODIMM sockets. If more than one memory module needs to be accessed, methods other than SPD address bits are used to access the memory modules.

When these SODIMMs are placed in computer systems not designed for them, the SODIMMs may only be placed in one particular slot, commonly called Slot 0. Because of this, only one SODIMM may be tested and used at one time. This results in excessive test time. These concepts will be more completely discussed in reference to the figures.

Figure 1:
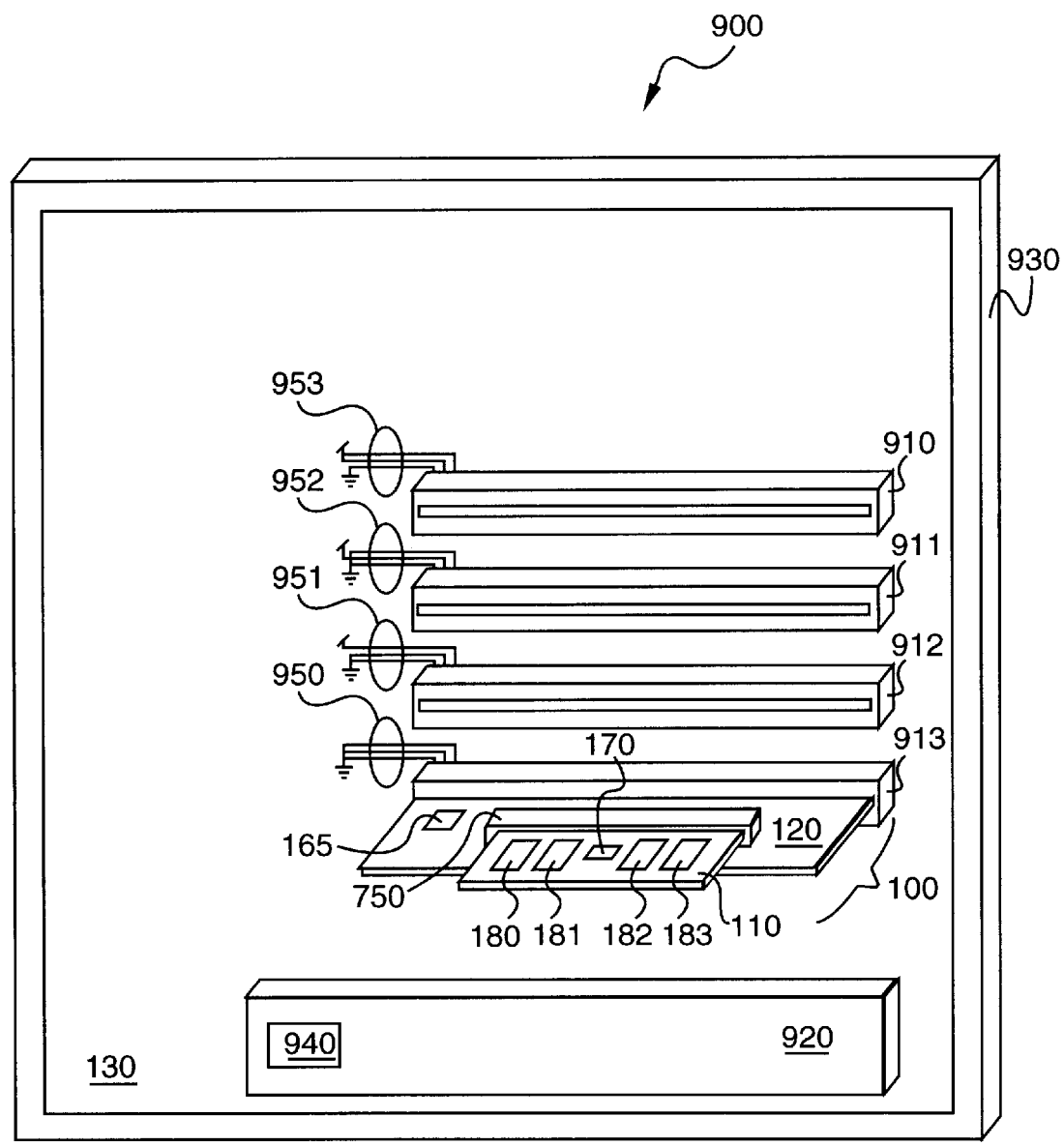
FIG. 1 is a perspective view of a computer system in accordance with a preferred embodiment of the current invention.

Turning now to FIG. 1, this figure shows a perspective view of a computer system operating in accordance with a preferred embodiment of the current invention. Computer system 100 comprises a case 930, a motherboard 130, a processor 920 having a memory 940, motherboard memory module connections 910, 911, 912, and 913, SPD address lines 950, 951, 952, and 953, and memory module interface 100. Memory module interface 100 comprises an interposer card 120 and a memory module 110. Interposer card 120 comprises a motherboard memory module connection system 750 and a detection device 165, which is a SPD device. Memory module 110 comprises a number of memory chips 180, 181, 182, and 187, and a detection device 170, which is a SPD device 170. It should be noted that memory module 110 could have additional memory chips on the side that is not shown in FIG. 1.

Detection devices for use with the current invention may be any detection device that allows a computer to access a memory module. To be able to access a memory module, the computer system would preferably determine at least the speed and size of the memory module. Any detection device that allows a computer system to do this is suitable for use with the current invention. As an example of this, a group of lines that are tied to specific potentials could be used as a detection device. For instance, if there are four lines, there could be 16 different combinations of potentials. Each combination would then determine the type of memory module, such as a "0010" could mean a 64 megabyte, 100 megahertz synchronous Dynamic Random Access Memory (DRAM). Because new types of memory are being created at a very rapid pace, it is preferred that the detection devices contain configuration information that allow a computer to properly access a memory module. Most preferably, the detection devices are serial presence detect devices, which are an industry-standard device having well known configuration information. Because the SPD devices are the most preferred embodiment of a detection device, the SPD devices will mainly be discussed herein. However, any detection device that allows a computer system to properly access a memory module may be used with the current invention.

For large computers, the SPD address lines going to the motherboard memory module connections 910 through 914 have unique addresses created by coupling the SPD address lines to unique combinations of power and ground. For instance, SPD address lines 950 are all connected to ground. These SPD address lines are commonly referred to as SA0, SA1, and SA2, where SA0 is the least significant bit. Thus, motherboard memory module connection 913, which in this example is a 168 pin DIMM socket, will be address zero. This DIMM socket is commonly called Slot 0. SPD address lines 951, on the other hand, have SA0 tied to power and SA1 and SA2 tied to ground. This means that the address of the motherboard memory module connection 912 will be address one. This DIMM socket is commonly called Slot 1. Similarly, SPD address lines 952 have SA1 tied to power and SA0 and SA2 to ground, while SPD address lines 953 have SA0 and SA1 tied to power and SA2 tied to ground. Thus, motherboard memory module connection 911 is address two (DIMM Slot 2), while motherboard memory module connection 910 is address three (DIMM Slot 3).

Figure 2:
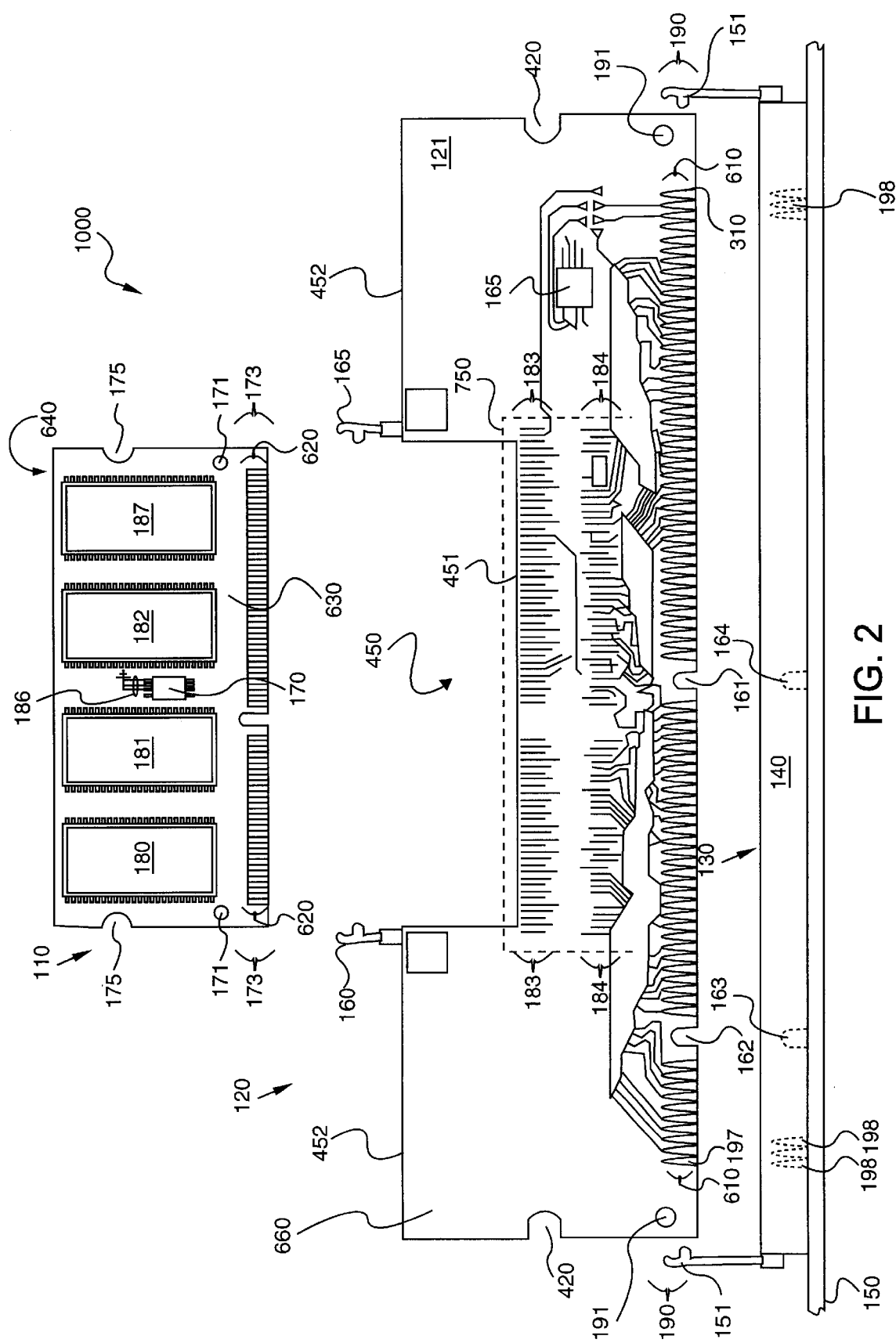
FIG. 2 is a front view of a memory module, an interposer card, and a motherboard memory module connection in accordance with a preferred embodiment of the present invention.

Therefore, for large computers, each motherboard memory module connection is able to be accessed independently. However, the memory made for small computer systems generally has its SPD address lines grounded because small computer system only supports one (at most two) memory modules. Turning briefly to FIG. 2, memory module 110 is shown in a larger view. Memory module 110 comprises an SPD 170 that has SPD address lines 186. These address lines, as indicated in FIG. 2 are grounded. Returning to FIG. 1, when an interposer 120 is used to connect memory module 110 to motherboard 130, without SPD 165, the interface 100 may only be placed in address zero because the SPD 170 has its SPD address lines grounded. When computer system 900 starts up, processor 920 will execute commands that test the memory in motherboard memory module connections 910 through 904. Computer system 900 will attempt to access each SPD on each memory module in each motherboard memory module connection 910 through 904. When the processor 920 accesses SPD 170 on memory module 110 (this assumes that SPD 165 is not on interposer card 120), the computer system will be able to access the SPD because the SPD believes that it is tied to address zero or Slot 0.

However, if interface 100 (without SPD 165) is placed into motherboard memory module connection 912, the computer system will not be able to access the memory module 110. This error happens because SPD 170 has its SPD address lines grounded. Thus, from the perspective of SPD 170, it is at address zero. The computer is attempting to access the SPD at address one (Slot 1). Normally, a DIMM placed into motherboard memory module connection 912 would have an SPD that accepts its SPD address from SPD address lines 951. An SPD on a DIMM would therefore determine that it was address one and would respond to the computer system 900. Because a SODIMM has its SPD address lines grounded on the SODIMM card, however, the SPD still thinks that it is address zero. In this case, the computer system 900 cannot contact SPD 170 on memory module 110 and the computer system incorrectly determines that no memory is installed at address one.

To over come this problem, the SPD 165 of the interposer 120 stands in place of the SPD 170 on the memory module 110. The SPD device 165 is programmed with the configuration information necessary to access memory module 110. The SPD can be manually programmed by using the data sheet for the memory module and programming the data into SPD 165, or the data from SPD device 170 can be read from the SPD and then used to program SPD device 165. Computer system 900 preferably accesses SPD 165 and not SPD 170. The SPD address lines on interposer 120 are not grounded on the interposer and instead are coupled to SPD address lines 950 (or 951, 952, 953, depending on which motherboard memory module connection 912, 911, 910, respectively, the interposer is in).

The present invention is useful any time a memory module contains a SPD device that has its SPD addresses tied to ground or power such that the SPD address is constant and wherein a computer system has motherboard memory module connections that require the SPD address to change to allow the computer to differentiate the memory modules. Consequently, memory module 110 is in this example a SODIMM, but could be any In-Line Memory Module (IMM) known to those skilled in the art or hereinafter developed. Motherboard memory module connection system 110 is in this example a SODIMM socket, but could be any connection system known to those skilled in the art or hereinafter developed. Similarly, motherboard memory module connections 910 through 913 are DIMM sockets, but can be any IMM connection known to those skilled in the art or hereinafter developed.

Although the memory module interface 100 of the present invention allows memory modules such as SODIMMs to be used in computer systems not designed to interface or support the memory modules, the current invention's best use is in testing. When testing these SODIMMs, the present invention allows one or more SODIMMs, up to the number of motherboard memory module connections on the motherboard, to be sequentially tested. Generally, a memory diagnostics program is run by processor 920. It should be noted that there could be multiple processors in computer system 900. The memory diagnostics program may be loaded directly into memory 940, which is usually a level 2 cache, or within one part of system memory (such as the first megabyte of system memory). This allows all four motherboard memory module connections 910 through 913 to be loaded with memory modules and to be tested. However, if there is one part of memory that contains the operating system and the memory diagnostics program, this memory will not be tested.

Another way to load the memory diagnostics program (and an operating system) is to use a DIMM or the memory module interface of the current invention that is known to be good in one of the motherboard memory module connections. This DIMM would contain the memory diagnostics program and operating system. This allows the remaining memory modules to be tested by running the memory diagnostics program out of the known good memory. Additionally, an EPROM or other programmable memory could be used to contain the memory diagnostics program. The processor 920 would then access the EPROM to receive instructions from the memory diagnostics program.

Turning now to FIG. 2, a side view of a portion 1000 of a computer system is shown. Computer system 1000 comprises memory module interface 100 and motherboard 130. Memory module interface 100 comprises memory module 110 and interposer card 120. Motherboard 130 comprises board 150 and motherboard memory module connection 140, which in this example is a DIMM socket. DIMM socket 140 is electrically connected to board 150. DIMM socket 140 has male keys 163 and 164, pressure tabs 198, and latches 151. Only a few pressure tabs 198 are shown; for a DIMM, there will be 168 such tabs.

Interposer card 120 comprises a board 121, latches 160, 165, tabs 183, 184, interposer memory module connection mechanism 750 (shown dashed to reveal the underlying tabs), notches 420, SPD device 165, holes 191, computer system connection mechanism 190, female key notches 162 and 161, and fingers 610. Board 121 has a top edge 452 and forms an opening 450 that has bottom edge 451. Interposer card 120 has a front side 660.

Memory module 110 comprises memory chips 180, 181, 182, and 187, a computer system connection mechanism 173, fingers 620, SPD device 170, SPD address lines 186 that are grounded, notches 175 and holes 171. It should be noted that memory module 110 will generally have more memory chips on the side of the module not shown in FIG. 2, as is known in the art. In this example, memory module 110 is a SODIMM that has a backside 640 (the side hidden in FIG. 2) and a front side 630 (the side not hidden in FIG. 2).

Figure 3:
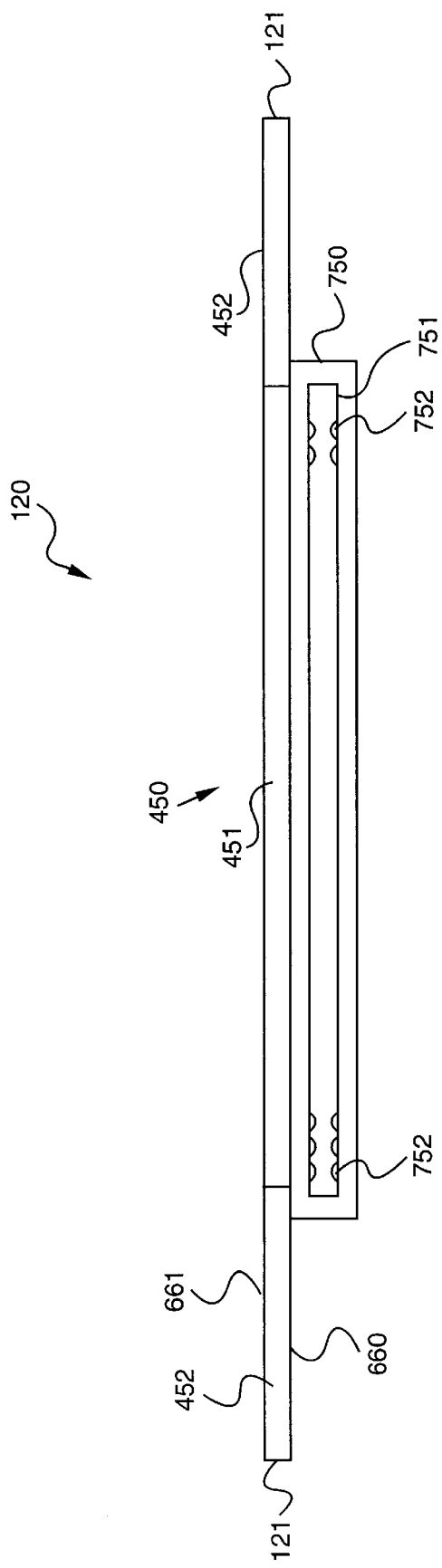
FIG. 3 is a top view of an interposer card in accordance with a preferred embodiment of the present invention.

Interposer memory module connection system 750 may be any mechanism that can electrically and mechanically connect an IMM to something. Interposer memory module connection system 750 is in this example a 144 pin SODIMM socket that has tabs that connect to tabs 183 and 184. SODIMM socket is an industry-standard socket that is used in portable computers, and it is well known in the art. Tabs 183 are tabs that correspond to fingers on the backside 640 of SODIMM 110, while tabs 184 are tabs that correspond to fingers on the front side 630 of SODIMM 110. Turning briefly to FIG. 3, this figure shows a top view of interposer card 120. In this view, it can be seen that SODIMM socket 750 SODIMM 110 is placed on the front side of interposer card 121 and comprises a plurality of pressure tabs 752 in slot 751. Computer system connection mechanism 173 on SODIMM 110 fits into slot 751 and fingers 620 mate with and electrically connect the SODIMM to the interposer 120. Computer system connection mechanism 173 in this instance is a well known edge connector, but could be any mechanism that allows an INM to be connected to another device. Opening 450 is sized such that any memory chips on SODIMM 110 will clear top surface 451.

Returning to FIG. 2, holes 171 fit into pins (not shown) in SODIMM socket 750, while latches 160 and 165 fit into there respective notches 175 on SODIMM 110. These devices mechanically lock SODIMM 110 to interposer card 121. Interposer card 121 is also mechanically and electrically connected to motherboard 130 by inserting computer system connection mechanism 190 into motherboard memory module connection 140. In this example, computer system connection mechanism 190 is an edge connector having fingers 610, but this could be any mechanism that can connect an interposer to a motherboard. Fingers 610 align with and contact pressure tabs 198 of DIMM socket 140. Again, pins (not shown) will align with and securely tie to holes 191. Female keys 161 and 162 align with male keys 163 and 164, respectively, and latches 151 interlock with notches 420. This holds the interposer mechanically in place.

SPD device 165 stands in place of SPD device 170 on SODIMM 110. SPD device 165 accepts SPD addresses of the slot into which it is entered. For instance, if it is entered into slot three of a personal computer or workstation, then the SPD device 165 would have address three. Again, the SPD address lines 186 of SODIMM 110 are grounded. The SPD device 165 must be programmed to contain the necessary information to enable a computer system to properly communicate with the SODIMM.

Figure 4:
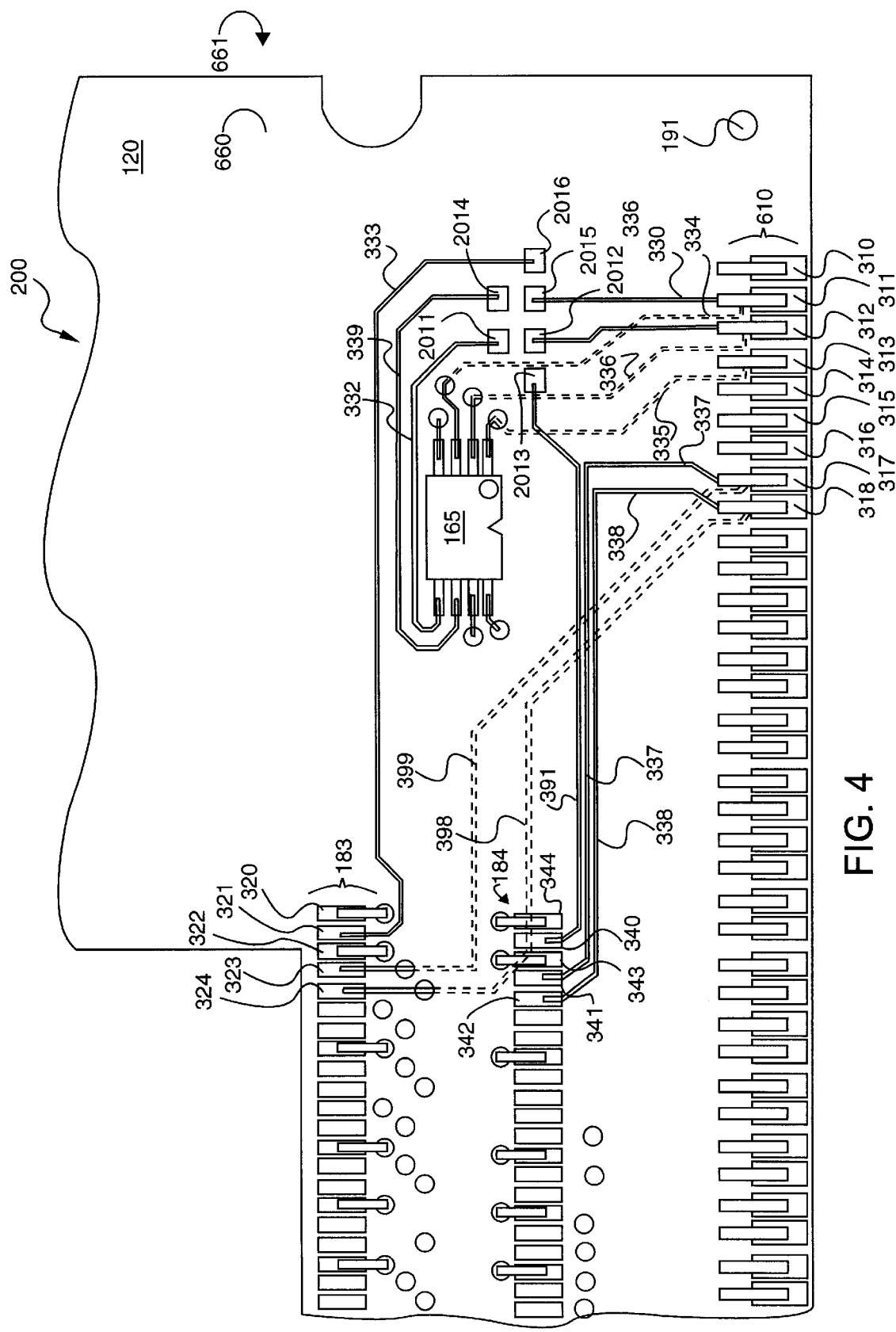
FIG. 4 is a portion of an interposer card shown in accordance with a preferred embodiment of the present invention.

Turning now to FIG. 4, a larger view of a portion of interposer card 120 is shown. Interposer card 120 comprises runs 330, 332, 333, 334, 335, 336, 337, and 338. Interposer card 120 also comprises resistor pads 2011, 2012, 2013, 2014, 2015, and 2016. Backside tabs 183 comprise tabs 320, 321, 322, 323, and 324. Front side tabs 184 comprise 340, 341, 342, 343, and 344. Fingers 610 comprise fingers 310, 311, 312, 313, 314, 315, 316, 317 and 318. SPD address lines 334, 335 and 336 come from fingers (not shown) on backside 661 of interposer card 120. These pads are opposite fingers 311, 313, and 312, respectively. The dashed lines indicate that the lines 334, 335, and 336 are on backside 661 of interposer card 120. On FIG. 4, only a few of the many lines are shown for simplicity. SPD 165 is also connected to SCL finger 311 and SDA finger 312 through lines 339 and 332, respectively.

Resistor pads 2011, 2012, 2013, 2014, 2015, and 2016 are used to connect SPD device 165 to fingers 311 and 312 (which have the serial data and command signals for the SPD device), or to optionally connect fingers 311 and 312 to the SPD device on memory module 110 (not shown in this figure). For instance, to connect SPD device 165 to fingers 311 and 312, a resistor would be soldered to pads 2011 and 2012, and a second resistor would be soldered to pads 2014 and 2015. To connect the SPD device on the memory module to fingers 311 and 312, a resistor would be soldered to pads 2013 and 2012, and a second resistor would be soldered to pads 2016 and 2015. It should be noted that only one of the SPD devices should be connected to fingers 311 and 312 at one time. Most preferably, SPD device 165 should be connected to these fingers, as this allows the memory module interface to be used in any slot in a large computer.

The following is a small table of finger numbers and the tabs to which they are connected. Also in the table are cross references to the DIMM and SODIMM pinouts. It should be noted that backside tabs 183 correspond to backside pin assignments two through 144 (even numbers only) on SODIMM 110, while front side tabs 184 correspond to front side pin assignments one through 143 (odd numbers only). Front side fingers 610 correspond to pin assignments one through 84 (all numbers) on interposer card 120, while the backside fingers (opposite front side fingers 610 and not shown) correspond to pin assignments 85 through 168 (all numbers). This meets the DIMM standard. These pinouts may be found in various locations and from various memory manufacturers. For example, Application note, "144 Pin SO DIMM Characteristics", from International Business Machines (IBM), contains SODIMM pin assignments for 8-byte SODIMMS. Similarly, the product data sheet, "8M× 64/72 One-Bank Unbuffered SDRAM Module" for products IBM 13N8644HCC and IBM 13N8734HCC contains DIMM pin assignments for DIMMS. Each of these is incorporated herein by reference.

| Finger | Signal | DIMM Pin No. | SODIMM Pin No. | Tab |
|---|---|---|---|---|
| 311 | SCL | 83 | 142 | 321 (through line 333) |
| 312 | SDA | 82 | 141 | 340 (through line 391) |
| 317 | DQ31 | 77 | 137 | 341 (through line 337) |
| Finger opposite 317 (on backside 661) | DQ63 | 161 | 138 | 323 (through line 399) |
| 318 | DQ30 | 76 | 135 | 342 (through line 338) |

-continued

| Finger | Signal | DIMM Pin No. | SODIMM Pin No. | Tab |
|---|---|---|---|---|
| Finger opposite 318 (on backside 661) | DQ62 | 160 | 136 | 324 (through line 398) |

Basically, each tab of tabs 183, 184 must be connected appropriately to an equivalent front side finger 610 or backside finger (not shown) on interposer card 120. Each tab of tabs 183, 184 must connect appropriately to front side fingers 620 and backside fingers (not shown) on SODIMM 110 of FIG. 2.

It should be noted that, for timing considerations, the lines on the interposer card should be as short as possible. In other words, these lines should be of minimum length. If longer lines than necessary are used, it could make it difficult to meet timing specifications for very fast RAM. In FIG. 4, it can be seen that the lines have runs that are as short as practicable.

Figure 5:
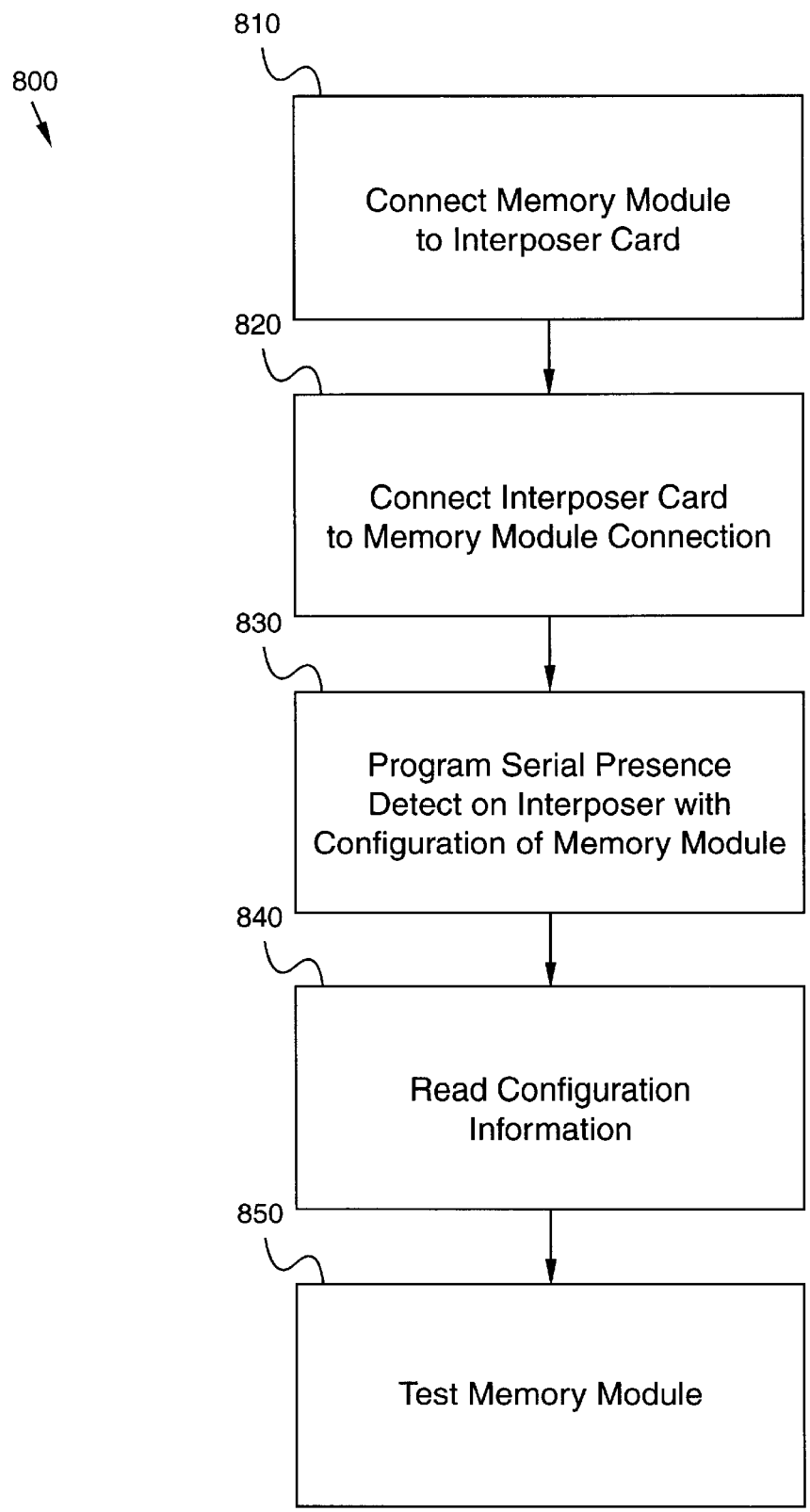
FIG. 5 is a method for interfacing a memory module with a computer system and for testing the interfaced memory module, in accordance with a preferred embodiment of the present invention.

Turning now to FIG. 5, a method 800 for using and testing a memory module in a computer system is shown. It should be noted that these method steps are not necessarily in this order; the order is only illustrative. Method 800 is used when a computer system, such as a personal computer, does not support the memory module that is going to be used or tested. In particular, method 800 is used when a SODIMM is to be used in a computer system that does not support the SODIMM. Method 800 allows the SODIMM to be used and tested in the computer system. In particular, this is done by providing an interposer that properly connects the memory module to the motherboard of the computer, and by providing a SPD device on the interposer that allows the computer system to determine the configuration of the memory module. The SPD device also allows the memory module interface to be used in any slot of the computer.

Method 800 begins when the memory module is connected to the interposer card. As stated previously, in the most preferred embodiment, a SODIMM is connected through its edge connector into a SODIMM socket on the interposer card (step 810). This connection is a mechanical and electrical connection. Next, the interposer card is connected to a memory module connection on the motherboard. In the most preferred embodiment of the present invention, the interposer card has a DIMM edge connector that mates with a DIMM socket.

In step 830, the SPD device on the interposer card is programmed with the appropriate configuration information to allow the computer system to access the memory module. In method 800, it is assumed that a programmable detection device, such as the most preferred SPD device, will be used. If the detection device is not programmable, and is read-only, then this step would not be performed. Exemplary read-only devices could be a set of connections that are tied to a particular voltage or a register. In the most preferred embodiment of the present invention, the detection device is a SPD device. The SPD device will preferably be an EPROM or other type of non-volatile Read-Only Memory, although any mechanism able to perform this information-storage function may be used with the current invention. As is known in the art, a SPD contains 128 bytes of information describing the speed of the memory module, how large the memory module is, and other information necessary to access the memory module. Another 128 bytes are available for the customer's use. There are multiple sources for SPD bytes and associated information. For example, the product data sheet, "8M×64/72 One-Bank Unbuffered SDRAM Module" for products IBM 13N8644HCC and IBM 13N8734HCC contains SPD byte information for SDRAMs. Similarly, the application note, "DRAM Module Serial Presence Detect Definitions" by IBM contains in depth information on bytes in SPDs. Finally, the application note, "Serial Presence Detect on Memory Dimms" by IBM contains information on bus protocols, memory addressing, and read and write operations on SPDs. Each of these is incorporated herein by reference.

It is possible to read the information from the SPD on the SODIMM and to program this information onto the SPD EPROM through an EPROM programmer. Alternatively, an engineer can use the data sheet for a particular memory module, such as a 133 MHz SODIMM, and program the SPD device with this information. Regardless of how the SPD device is programmed, the SPD device on the interposer card will be accessed by the computer system so that the computer system can retrieve the information in the SPD and then properly access the memory module.

In step 840, the computer system reads the configuration information from the SPD on the interposer. Generally, this step occurs after reset or on startup of the computer system. The SPD on the memory module is not used because the SPD address lines are grounded on the memory module. The SPD on the interposer, however, gets its address from address lines on the motherboard (see FIG. 1). Thus, the SPD device on the interposer allows the memory module to be placed in any slot in a computer.

In step 850, the computer system will access the memory module and test the memory module. Testing the memory module may be done by any method known to those skilled in the art. For instance, alternate ones and zeros may be written to adjacent memory cells (a pattern such as 101010 . . . ) and then reversed (010101 . . . ). There are many testing algorithms known to those skilled in the art. The goal of these testing algorithms is two fold: one is to ensure that the memory meets timing considerations in a real-world computer system environment; the second is to ensure the integrity of the memory and that the memory is free from errors. Additionally, poor soldering or cross-connected fingers or pads may be found.

Thus, method 800 shows how to use and test a memory module in a computer system not specifically designed for the module.

Turning now to FIG. 6, a small portion of the bytes in the most preferred detection device, an SPD device, are shown. This table indicates some of the bytes in an SPD device, which could be the SPD device on the interposer or on the memory module. Additional bytes are described with more particularity in the references given above in reference to method 800. For an SDRAM, byte 2 would be 04 in hexadecimal. If byte 1 was 08 in hexadecimal, this would indicate that the SPD had 256 total bytes. For byte 15, if there is a one clock minimum clock delay, the value in that byte should be 01 in hexadecimal. For byte 16, if the burst lengths supported are 1, 2, 4, 8, and full page, the value in byte 16 should be 8F in hexadecimal. Those skilled in the art may program an SPD to contain the information necessary to allow a computer system to properly access the memory module.

What has been shown is a memory module interface and computer system using the same. These allow a memory module to be used and tested in a computer system not designed for the module. The interface provides both a mechanical interface and an detection device. In the most preferred embodiment, the memory module interface is a SODIMM, with its own SPD, that connects to an interposer card, with a second SPD. The interposer card meets the DIMM specification and plugs into a DIMM socket. The SPD device on the interposer is used by the computer system to configure itself to access the SODIMM. The SPD on the SODIMM is preferably not used. This allows the memory module interface to be placed in any slot in a computer and it allows multiple SODIMMs to be used and tested at once.

While the invention has been particularly shown and described with reference to preferred embodiments thereof, it will be understood by those skilled in the art that various changes in form and details may be made therein without departing from the spirit and scope of the invention. For example, the detection device could be one or more registers, a group of lines that are tied to a certain potential, a parallel device instead of a serial device, etc. Unless otherwise specified, any dimensions of the apparatus indicated in the drawings or herein are given as an example of possible dimensions and not as a limitation. Similarly, unless otherwise specified, any sequence of steps of the method indicated in the drawings or herein are given as an example of a possible sequence and not as a limitation.

What is claimed is:

1. A memory module interface for use in a computer system, the interface comprising:
    a memory module;
    an interposer card having a memory module connection mechanism and a computer system connection mechanism, the memory module connection mechanism connecting the memory module to the interposer card, the computer system connection mechanism allowing the interposer card to be connected to a computer system;
    a first detection device electrically attached to the interposer card, the first detection device comprising a plurality of address connections, each address connection of the first detection device being coupled to power or of ground, at least one address connection of the first detection device being coupled to power, said plurality of address connections collectively providing information that allows the computer system to access the memory module, and
    a second detection device comprised by the memory module, the second detection device comprising a plurality of address connections, each address connection of the second detection device being coupled to the ground.

2. The interface of claim 1 wherein the first detection device comprises a first Serial Presence Detect (SPD) device, and wherein the second detection device comprises a second SPD device.

3. The method of claim 1, wherein each motherboard memory module connection comprises a group of detection device address lines, wherein each group comprises a plurality of detection device address lines, wherein each of the groups of detection device address lines has a unique address created by coupling the detection device address lines in each of the groups to unique combinations of ground and power.

4. The interface of claim 2 wherein the first SPD device comprises at least one configuration data, the at least one configuration data describing configuration of the memory module, and wherein each of the at least one configuration data is one byte of data.

5. The interface of claim 2 wherein the computer system connection mechanism comprises a plurality of fingers, and wherein each of the plurality of address connections of the first SPD device is coupled to one of the fingers.

6. The interface of claim 4 wherein:
    the memory module comprises a Small Outline Dual In-line Memory Module (SODIMM) comprising the second SPD device electrically coupled to the SODIMM, the second SPD device comprising three address connections, wherein the SODIMM couples each of the three address connections of the second SPD device to ground;
    the at least one configuration data is a plurality of configuration data;
    the first SPD device comprising timing and size information in the plurality of configuration data to allow the computer system to access the SODIMM; and
    the computer system connection mechanism is a Dual In-Line Memory Module edge connector.

7. The interface of claim 5 wherein the first SPD device further comprises a serial data connection coupled to one of the plurality of fingers, the serial data connection allowing the computer system to read information in the at least one configuration data from the first SPD device.

8. A computer system for testing memory modules, the computer system comprising:
    at least one processor;
    a plurality of motherboard memory module connections coupled to the at least one processor, each motherboard memory module connection comprising a group of detection device address lines, wherein each group comprises a plurality of detection device address lines, wherein each of the groups of detection device address lines has a unique address created by coupling the detection device address lines in each of the groups to unique combinations of ground and power;
    a memory module, the memory module comprising a first detection device;
    an interposer card, the interposer card connected to one of the plurality of motherboard memory module connections through a computer system connection mechanism and connected to the memory module, the interposer card comprising a second detection device electrically coupled to the interposer card and providing information that allows the computer system to access the memory module, and wherein the at least one processor accesses the second detection device to determine configuration of the memory module, wherein the detection device on the memory module comprises three address connections that are all coupled to ground.

9. The computer system of claim 8 wherein the second detection device comprises a plurality of configuration data that describes configuration of the memory module.

10. The computer system of claim 8 wherein:
    the memory module comprises a Small Outline Dual In-line Memory Module (SODIMM);
    the plurality of motherboard memory module connections are Dual In-Line Memory Module (DIMM) sockets; and
    the computer system connection mechanism is a Dual In-Line Memory Module edge.

11. The computer system of claim 8 wherein the at least one processor executes a memory diagnostics program, the memory diagnostic program testing the memory module for errors.

12. The method of claim 8, the first detection device comprising at least one address connection, each address connection of the first detection device being coupled to power or ground, at least one address connection of the first detection device being coupled to power.

13. The computer system of claim 9 wherein the second detection device is a Serial Presence Detect (SPD) device and wherein each of the plurality of configuration data is one byte of data.

14. The computer system of claim 13 wherein the second SPD device further comprises a serial data connection coupled to the processor, the serial data connection allowing the processor to read information in the plurality of configuration data from the SPD device.

15. The computer system of claim 14 wherein the plurality of configuration information comprises size and timing information for the memory module.

16. A method for interfacing a memory module within a computer system, the method comprising the steps of: p1 providing the computer system having a plurality of motherboard memory module connections;

providing a memory module comprising a first detection device, the first detection device comprising at least one address connection each, address connection of the first detection device being coupled to ground;

providing an interposer card having a motherboard memory module connection mechanism and a computer system connection mechanism, the interposer card also comprising a second detection device electrically attached to the interposer card, the second detection device providing information that allows the computer system to access the memory module, the second detection device comprising at least one address connection, each address connection of the second detection device being coupled to power or ground, at least one address connection of the second detection device being coupled to power;

connecting the memory module to the interposer card;

connecting the interposer card to one of the motherboard memory module connections of the computer system;

accessing the second detection device to determine a configuration of the memory.

17. The method of claim 16 wherein the second detection device comprises a plurality of data and further comprising the step of:

programming at least some of the plurality of data of the second detection device of the interposer card such that the second detection device comprises configuration information for the memory module.

18. The method of claim 16 wherein the step of accessing the memory module comprises the steps of:

providing a memory diagnostic program; and testing the memory module with the memory diagnostic program.

19. The method of claim 16 wherein:

the memory module comprises a Small Outline Dual In-line Memory Module (SODIMM)

the motherboard memory module connection into which the interposer card is connected is a Dual In-Line Memory Module (DIMM) socket.

20. The method of claim 17 wherein the first detection device is a Serial Presence Detect (SPD) device comprising a plurality of first data, wherein the second detection device is a SPD device comprising a plurality or second data, and wherein the step of programing further comprises the steps of:

reading the plurality of first data from the first SPD device; and programing this plurality of first data into the second SPD.

21. The method of claim 1, wherein the memory module connection mechanism comprises a group of detection device address lines, wherein the group comprises a plurality of detection device address lines, wherein the group of detection device address lines has a unique address created by coupling the first detection device address lines in the group to unique combinations of ground and power.

* * * * *